(12) United States Patent
Lung et al.

(10) Patent No.: US 8,084,760 B2
(45) Date of Patent: Dec. 27, 2011

(54) RING-SHAPED ELECTRODE AND MANUFACTURING METHOD FOR SAME

(75) Inventors: Hsiang-Lan Lung, Elmsford, NY (US); Shih-Hung Chen, Hsinchu County (TW); Stephen M. Rossnagel, Pleasantville, NY (US)

(73) Assignee: Macronix International Co., Ltd., Hsinchu (TW)

( * ) Notice: Subject to any disclaimer, the term of this patent is extended or adjusted under 35 U.S.C. 154(b) by 73 days.

(21) Appl. No.: 12/426,809

(22) Filed: Apr. 20, 2009

(65) Prior Publication Data

US 2010/0264396 A1    Oct. 21, 2010

(51) Int. Cl.
*H01L 29/02* (2006.01)

(52) U.S. Cl. .. 257/2; 257/3; 257/4; 257/5; 257/E29.002; 438/102; 438/103; 365/163

(58) Field of Classification Search .......... 257/2–5, 257/E29.002; 438/102–103; 365/163
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi et al. |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |

(Continued)

OTHER PUBLICATIONS

"Magnetic Bit Boost," www.sciencenews.org, Dec. 18 & 25, 2004, p. 389, vol. 166.

(Continued)

*Primary Examiner* — Jami M Valentine
(74) *Attorney, Agent, or Firm* — Haynes Beffel & Wolfeld LLP

(57) ABSTRACT

An electrode structure and a method for manufacturing an integrated circuit electrode includes forming a bottom electrode comprising a pipe-shaped member, filled with a conductive material such as n-doped silicon, and having a ring-shaped top surface. A disc-shaped insulating member is formed on the top of the pipe-shaped member by oxidizing the conductive fill. A layer of programmable resistance material, such as a phase change material, is deposited in contact with the top surface of the pipe-shaped member. A top electrode in contact with the layer of programmable resistance material.

13 Claims, 12 Drawing Sheets

U.S. PATENT DOCUMENTS

| | | | |
|---|---|---|---|
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan et al. |

| Patent No. | Date | Inventor |
|---|---|---|
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,388,273 B2 | 6/2008 | Burr et al. |
| 7,394,088 B2 | 7/2008 | Lung |
| 7,397,060 B2 * | 7/2008 | Lung .................. 257/2 |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,485,891 B2 | 2/2009 | Hamann et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 2002/0070457 A1 | 6/2002 | Sun et al. |
| 2002/0079483 A1 | 6/2002 | Dennison |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127347 A1 | 6/2005 | Choi et al. |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0045606 A1 | 3/2007 | Magistretti et al. |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0152205 A1 * | 7/2007 | Chen .................. 257/4 |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |

| | | | |
|---|---|---|---|
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0138929 A1 | 6/2008 | Lung | |
| 2008/0138930 A1 | 6/2008 | Lung | |
| 2008/0138931 A1 | 6/2008 | Lung | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0203375 A1 | 8/2008 | Lung | |
| 2008/0224119 A1 | 9/2008 | Burr et al. | |
| 2008/0225489 A1 | 9/2008 | Cai et al. | |
| 2008/0265234 A1 | 10/2008 | Breitwisch et al. | |
| 2008/0303014 A1 | 12/2008 | Goux et al. | |
| 2008/0308784 A1* | 12/2008 | Oh et al. | 257/4 |
| 2008/0315174 A1 | 12/2008 | Kang et al. | |
| 2009/0001341 A1 | 1/2009 | Breitwisch et al. | |
| 2009/0014704 A1 | 1/2009 | Chen et al. | |
| 2009/0023242 A1 | 1/2009 | Lung | |
| 2009/0027950 A1 | 1/2009 | Lam et al. | |
| 2009/0042335 A1 | 2/2009 | Lung | |
| 2009/0057641 A1 | 3/2009 | Lung | |
| 2009/0098678 A1 | 4/2009 | Lung | |
| 2009/0166603 A1 | 7/2009 | Lung | |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Tehcnology, Systems and Applications, Apr. 23-25, 2007, pp. 1-2.
Axon Technologies Corporation paper: Technology Description, published in 1997, pp. 1-6.
Bedeschi, F. et al., "4-MB MOSFET-Selected Phase-Change Memory Experimental Chip," IEEE, 2004, 4 PP.
Blake thesis, "Investigation of GeTeSb5 Chalcogenide Films for Use as an Analog Memory," AFIT/GE/ENG/00M-04, Mar. 2000, 121 pages.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, AN et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.
Gilbert, Nad E., "A macro model of programmable metallization cell devices," Solid-State Electronics 49 (2005) 1813-1819.
Gill, Manzur et al., "A High-Performance Nonvolatile Memory Technology for Stand-Alone Memory and Embedded Applications," 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," 2003 Symposium on VLSI Technology Digest of Technical Papers, pp. 175-176.
Hanzawa, Satoru, et al., "A 512kB Embedded Phase Change Memory with 416kB/s Write Throughput at 100 µA Cell Write Current," ISSCC 2007, Session 26, Non-Volatile Memories/26.2, 3 pages.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.
Kim, Kinam et al., "Reliability Investigations for Manufacturable High Density PRAM," IEEE 43rd Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.
Lacita, A. L., "Electrothermal and Phase-change Dynamics in Chalcogenide-based Memories," IEEE IEDM 2004, 4 pp.
Lai, Stefan, "Current Status of the Phase Change Memory and Its Future," IEEE IEDM 2003, pp. 255-258.
Lai, Stephan et al., "OUM-A 180 nm Nonvolatile Memory Cell Element Technology for Stand Alone and Embedded Applications," IEEE IEDM 2001, pp. 803-806.
Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.
Lung, Hsiang-Lan, et al., "Mushroom Type Memory Cell Having Self-Aligned Bottom Electrode and Diode Access Device," U.S. Appl. No. 12/177,435, filed Jul. 22, 2008, 89 pages.
Mott, Nevill, "Electrons in Glass," Nobel Lecture, Dec. 8, 1977, Physics, 1977, pp. 403-413.
Oh, Hyung-Rok, et al., "Enhanced Write Performance of a 64Mb Phase-Change Random Access Memory," ISSCC 2005, Session 2, Non-Volatile Memory, 2.3, 3 pages.
Oh, J.H., et al., "Full Integration of Highly Manufacturable 512Mb PRAM based on 90nm Technology," IEEE IEDM Technical Digest, pp. 49-52, 2006.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Non-volatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

FIG. 1
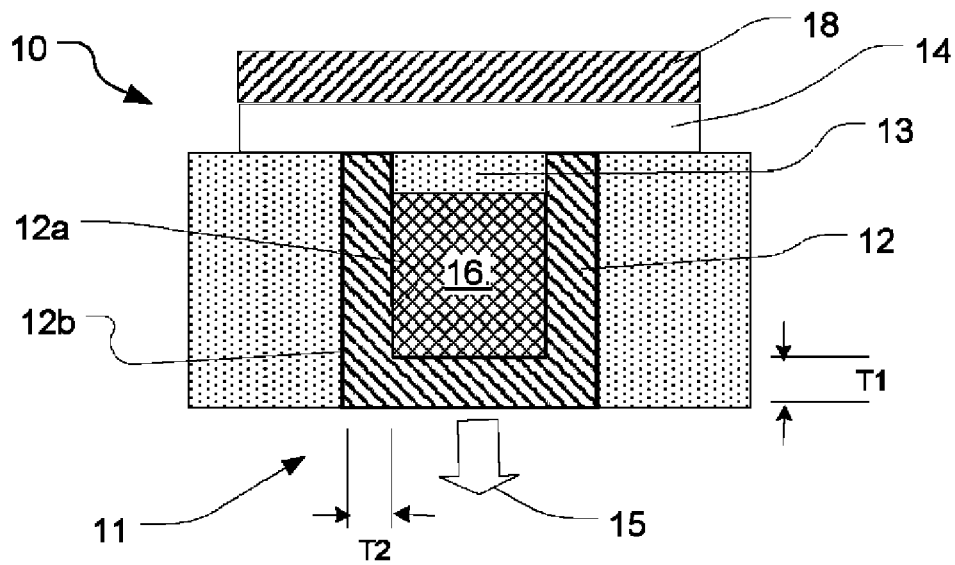
FIG. 2
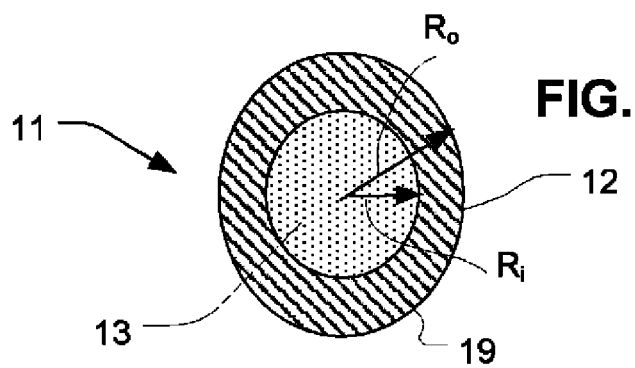
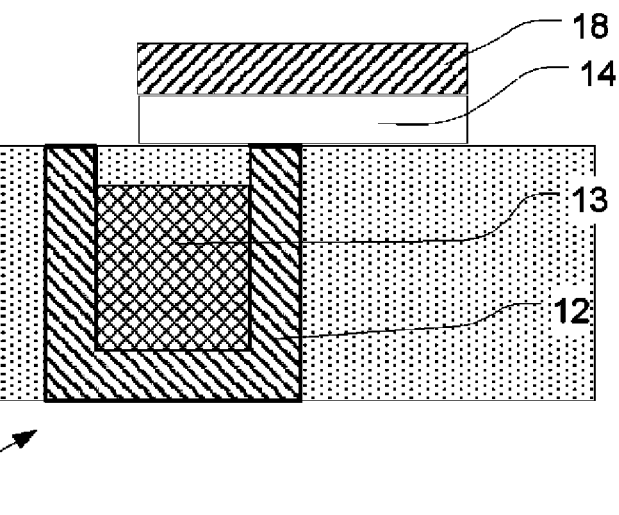
FIG. 3

RING-SHAPED ELECTRODE AND MANUFACTURING METHOD FOR SAME

PARTIES TO A JOINT RESEARCH AGREEMENT

International Business Machines Corporation, a New York corporation; and Macronix International Corporation, Ltd., a Taiwan corporation, are parties to a Joint Research Agreement.

BACKGROUND OF THE INVENTION

1. Field of the Invention

The present invention relates to ring-shaped electrodes usable in high density memory devices based on programmable resistance material, like phase change based memory materials, and to methods for manufacturing such devices.

2. Description of Related Art

Chalcogenide materials are widely used in read-write optical disks. These materials have at least two solid phases, generally amorphous and generally crystalline. Laser pulses are used in read-write optical disks to switch between phases and to read the optical properties of the material after the phase change.

Chalcogenide materials also can be caused to change phase by application of electrical current. This property has generated interest in using programmable resistance material to form nonvolatile memory circuits.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

One type of bottom electrode structure that provides a small surface area contact is a ring-shaped electrode. See, Lai, U.S. Pat. No. 6,881,603, entitled Phase Change Material Memory Device, issued 19 Apr. 2005; Lowrey et al., U.S. Pat. No. 6,943,365, entitled Electrically Programmable Memory Element with Reduced Area of Contact and Method for Making Same issued 13 Sep. 2005; Lung, U.S. Patent Application Publication No. US 2007/0215852, entitled Manufacturing Method for Pipe-shaped Electrode Phase Change Memory, published on 20 Sep. 2007; and Lung, U.S. Patent Application Publication No. US 2008/0203375 entitled Memory Cell with Memory Element Contacting Ring-Shaped Upper End of Bottom Electrode. One benefit of ring-shaped electrodes arises from the geometry of the ring-shaped surface. Specifically, variations in diameters of the ring-shaped surface, and in thicknesses of the sidewalls on the pipe-shaped members at the ring-shaped surface have relatively little effect on the cell operational characteristics, allowing for more uniform distributions of cell characteristics across a large array than is available with other structures.

One problem with ring-shaped electrodes arises from the increased resistance due to the small cross-sectional area of the electrode orthogonal to the current flow direction. The increase in resistance requires a higher voltage across the memory cell to achieve a given current and increases the power consumption of the device. Also, in processes for forming a ring-shape electrode, thin-film sidewall structures are formed. It is difficult to manufacture such sidewall structures that have uniform thicknesses along the length of the electrode, particularly as the thicknesses of the sidewall structures used for the ring-shaped electrode fall below about 30 nanometers. Thus, thin spots can occur in the thin-film sidewalls which may result in unevenness in current flow around the ring, and even discontinuities in the structure that can affect manufacturing yield.

Accordingly, an opportunity arises to devise methods and structures that form memory cells with structures that have small active regions of programmable resistance material using reliable and repeatable manufacturing techniques.

SUMMARY OF THE INVENTION

The present invention includes devices and methods to form an electrode structure for an integrated circuit device such as a memory cell, including a small, ring-shaped contact area, while maintaining low resistance and high yield.

An integrated circuit device is described comprising a pipe-shaped member of electrode material with a ring-shaped top surface. The pipe-shaped member has an axis, a first end and a second end. Side walls of electrode material form the pipe-shaped member with a thickness in a dimension orthogonal to the axis of the pipe-shaped member. A first end of the pipe-shaped member contacts an underlying contact element. Preferably, the first end of the pipe-shaped member is closed with electrode material, which can be the same as or different from that used to form the sidewalls. A second end of the pipe-shaped member has a ring-shaped surface that acts as the contact surface for the electrode. A first layer of conducting fill material is inside the inside surface of the pipe-shaped member. The first layer of conducting fill material comprises a conductive material. A second layer of insulating fill material is on top of the first layer of fill material inside the inside surface of the pipe-shaped member. The second layer of insulating fill material can be relatively thin so that the length of the pipe-shaped member which extends above the first layer of conducting fill material is short. As a result of the combination of conducting fill material and insulating fill material, the resistance of the electrode structure is significantly reduced. Also, the reliability in manufacturing of the electrode structure is improved. The conducting fill material can be a doped polysilicon, other silicon material, or other material characterized by being readily oxidized to form an insulating oxide. The second layer of fill material can be an oxide of the conducting fill material used to form the first layer of fill material. Thus, in examples where the first layer of fill material comprises silicon, the second layer of fill material comprises silicon dioxide. The resulting structure has a pipe-shaped element that has relatively lower resistance because of the conductivity of the first layer of fill material, while providing an easily manufactured ring-shaped contact surface.

A memory device includes a programmable resistance material in contact with the ring-shaped top surface of the bottom electrode. A top electrode is formed over the programmable resistance material.

Methods for manufacturing an electrode as described above are also set forth herein. The process includes forming an electrode comprising a pipe-shaped member with the first and second layers of film and material as described above. Representative processes include a via-based process, in which the pipe-shaped member is formed by a conformal deposition of electrode material within a patterned via through an insulating layer. The first layer of conducting fill material is formed within the resulting lined vias. The second layer of insulating fill material is then formed. An alternative, pillar-based process is also described. The process includes forming a pillar, which includes the first layer of fill material, and preferably a layer of electrode material beneath it. The pipe-shaped member is formed by conformal deposition of electrode material over the pillar. After depositing a fill layer surrounding the lined pillars, and polishing the structure to expose the ring-shaped top surfaces of the pipe-shaped members, the first layer of insulating fill material within the pipe-shaped members is formed.

In one process described herein, the second layer of insulating fill material is formed by oxidizing or nitridizing a top surface of the conducting fill material. In an alternative, the first layer of insulating fill material is formed by forming a recess-etch in the first layer of conducting fill material, then filling the recess with insulating fill material and polishing the surface to expose the ring-shaped shaped surface of the electrode.

To form a memory device, a programmable resistance material is formed in contact with the ring-shaped top surface of the bottom electrode. A top electrode is formed over the programmable resistance material, and the integrated circuit is completed.

Other aspects and advantages of the technology described herein can be understood with reference to the figures and the detailed description which follow.

BRIEF DESCRIPTION OF THE DRAWINGS

FIG. 1 is a cross-section view of an embodiment of a memory cell based on a pipe-shaped electrode coupled to a programmable resistance material.

FIG. 2 is an orthogonal view of the ring-shaped top surface of an electrode as shown in FIG. 1.

FIG. 3 is a cross-section via of an alternate embodiment of a memory cell based on a pipe-shaped electrode coupled to an offset programmable resistance material.

DETAILED DESCRIPTION

Figure 4:
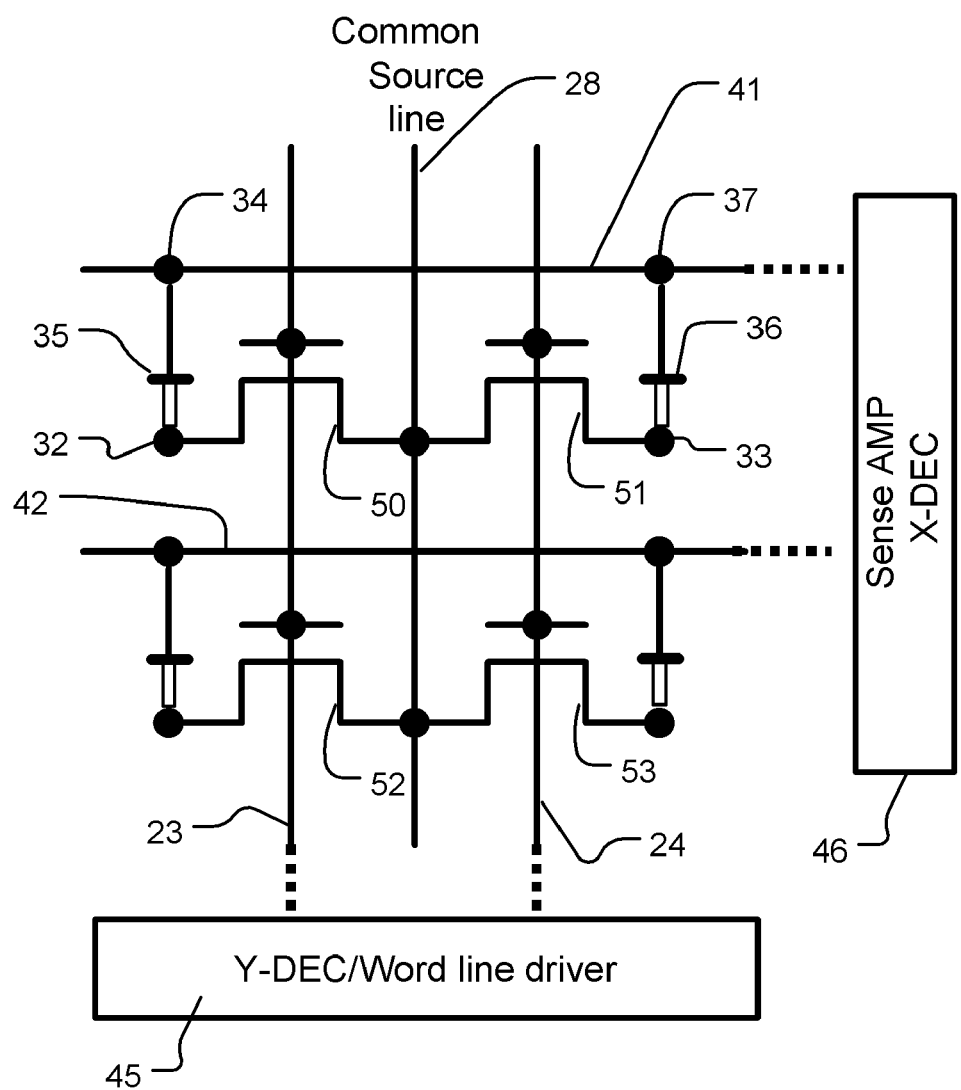
FIG. 4 is a circuit schematic of a memory array including memory elements like those shown in FIG. 1.

The following detailed description is made with reference to the figures. Preferred embodiments are described to illustrate the present invention, not to limit its scope, which is defined by the claims. Those of ordinary skill in the art will recognize a variety of equivalent variations on the description that follows.

FIG. 1 is a simplified cross-sectional view of a phase change memory cell 10 including a pipe-shaped electrode having a ring-shaped top surface. The cell includes a bottom electrode 11 in contact with a terminal (schematically arrow 15) of an access structure. The bottom electrode includes a pipe-shaped member 12 having a first end adjacent the terminal 15, and a second end opposite the first. The pipe-shaped member 12 comprises an electrode material, such as TiN or other electrode materials. In the illustrated embodiment, the pipe-shaped member 12 is filled with conductive material 16, such as n-doped polysilicon that can be oxidized or nitridized as explained below. An insulating fill material forms a cap member 13, comprising for example an oxide or nitride of the conductive material 16, covers the conductive fill material 16 at the top of the pipe-shaped member 12. In this example, the cap member 13 comprises silicon oxide, and the conductive fill material comprises silicon. Alternatively, the cap member 13 may comprise silicon nitride, and the conductive fill material may comprise silicon. A layer 14 of programmable resistance memory material is formed in contact with the ring-shaped top surface of the pipe-shaped member 12. A top electrode 18 is formed in electrical communication with the layer 14 of programmable resistance memory material.

The pipe-shaped member 12 comprises sidewalls with a thickness orthogonal to the axis of the pipe-shaped member, with an inside surface 12a and an outside surface 12b, which are cylinder-like. Thus, the inside and outside surfaces 12a, 12b can be understood as basically cylindrical surfaces, classically defined as surfaces traced by a line moving parallel to a fixed line and intersecting a fixed curve, where for a circular cylinder the fixed line lies at the center, or axis, of the pipe-shaped member and the fixed curve is a circle centered on the fixed line. The inside and outside surfaces 12a, 12b for this circular cylindrical shape would be defined by respective circles having radii that differ by the thickness of the wall of the pipe-shaped member, and thus define the inside and outside diameters of the pipe-shaped member. In embodiments of the pipe-shaped member, the cylinder-like shape has an outside perimeter that is circular, elliptical, rectangular or somewhat irregularly shaped, depending on the manufacturing technique applied to form the pipe-shaped member. The "ring-shaped" top surface described herein, is therefore not necessarily circular, but rather takes the shape of a cross-section of the pipe-shaped member which can be rectangular for example, resulting in a structure that could also be called a trench-shaped structure. The thickness T1 of the first end of the pipe-shaped member 12 can be different than the thickness T2 of the sidewalls. Alternatives can have the pipe-shaped member with an opening at the first end.

FIG. 2 shows a top view of the ring-shaped surface 19 at the second end of the pipe-shaped bottom electrode 11 of FIG. 1. The bottom electrode 11 includes the pipe-shaped member 12, filled with material 16, and the oxide cap member 13. The area of top surface 19 is determined by the thickness T2 of sidewalls of the pipe-shaped member 12, which is determined by the difference in the inside and outside radii ($R_i$ and $R_o$) of the pipe-shaped member 12. As the outside radius $R_o$ of the pipe-shaped member 12 varies across the array due to variances in the manufacturing processes, the difference in the area of the ring-shaped surface 19 will vary only as the difference between $R_i$ and $R_o$, which can be very small.

In embodiments described herein, the pipe-shaped member consists of a thin film of electrode material on the sides of a via or the sides of pillar. Thus the walls of the pipe-shaped member can be very thin and for example, less than 30 nanometers, in order to achieve acceptable performance in programmable resistance memory devices. The thickness is determined by the process used to deposit thin films conformally over the inside walls of vias or over the surface of pillars. Many conductors can be used for the electrode material of the pipe-shaped member 12, including for example aluminum and aluminum alloys, TiN, TaN, TiAlN or TaAlN. TiN or TaN may be preferred in embodiments in which memory material in layer 14 comprises GST because it makes good contact with GST, it is a common material used in semiconductor manufacturing, and it provides a good diffusion barrier at the higher temperatures at which GST transitions, typically in the 600°-700° C. range. Alternatively, the electrode material may comprise, for example, one or more elements from the group of Ti, W, Mo, Al, Ta, Cu, Pt, Ir, La, Ni, N, O, and Ru.

In one embodiment, the material of the pipe-shaped member is chosen based on the characteristic that it does not oxidize, or does not oxidize as fast as the conductive fill material 16, under a process such as thermal oxidation used to form the insulating cap member 13, as will be seen in the manufacturing processes described below. Alternatively, the material of the pipe-shaped member is chosen based on the characteristic that it does not nitridize as fast as the conductive fill material 16 under a process such as exposure to ammonium used to form the insulating cap member 13.

A memory cell 10 as described herein is readily manufacturable using standard lithography and thin film deposition technologies, without requiring extraordinary steps to form sub-lithographic patterns, while achieving very small dimensions for the region of the cell that actually changes resistivity during programming. The programmable resistance material comprises for example a phase change material, such as $Ge_2Sb_2Te_5$ or other materials described below. The active region in the cell 10 that changes phase is small; and accordingly, the magnitude of the reset current required for changing the phase is very small.

FIG. 3 illustrates an alternative embodiment in which the memory material in layer 14 is patterned, and offset to one side of the ring-shaped surface of the bottom electrode, reducing the area of the active contact between the bottom electrode 11 and the memory material. The structure of FIG. 3 is the same as that shown in FIG. 1, other than the offset of the memory material. In another alternative, a fill material may be formed over the structure, followed by formation of a trench that overlies the top surface of the ring-shaped electrode. The memory material is then deposited within the trench to form a memory element in contact with the rim of the electrode.

In operation, current flows on a path including a terminal 15 in an access device, the sides of the pipe-shaped member 12 and the ring-shaped surface where it contacts the programmable resistance memory material in layer 14. The current path further includes the top electrode member 18, and any circuitry coupling the electrode member 18 to overlying access structures such as a metal line. The active region, generally in the location within the programmable resistance memory material near the ring-shaped surfaces of the pipe-shaped members, in which the phase change occurs due to heat caused by the current flow, can be very small, reducing the magnitude of current needed for reset. Furthermore, because of the geometry of the ring-shaped surface, variations in diameters of the pipe-shaped members, and in thicknesses of the sidewalls on the pipe-shaped members have relatively little effect on the cell operational characteristics, allowing for more uniform distributions of cell characteristics across a large array than is available with other structures.

Embodiments of the programmable resistance material 14 include phase change based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides.

Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistance memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), $NiO$, $Nb_2O_5$, $CuO_2$, $Ta_2O_5$, $Al_2O_3$, $CoO$, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

An exemplary method for forming chalcogenide material uses chemical vapor deposition CVD such as that disclosed in US Publication No 2006/0172067 entitled "Chemical Vapor Deposition of Chalcogenide Materials", which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

FIG. 4 is a schematic illustration of a memory array, which can be implemented as described herein. In the schematic illustration of FIG. 4, a common source line 28, a word line 23 and a word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and a set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the bottom electrode member 32 for pipe-shaped electrode memory cell 35, which has top electrode member 34. The top electrode member 34 is coupled to the bit line 41. Likewise, the drain of access transistor 51 is coupled to the bottom electrode member 33 for pipe-shaped electrode memory cell 36, which has top electrode member 37. The top electrode member 37 is coupled to the bit line 41. Access transistors 52 and 53 are coupled to corresponding pipe-shaped electrode memory cells as well on bit line 42. It can be seen that the common source line 28 is shared by two rows of memory cells, where a row is arranged in the Y-direction in the illustrated schematic. In other embodiments, the access transistors can be replaced by diodes, or other structures for controlling current flow to selected devices in the array for reading and writing data. Of course, other types of access devices and array structures can be used.

Figure 5:
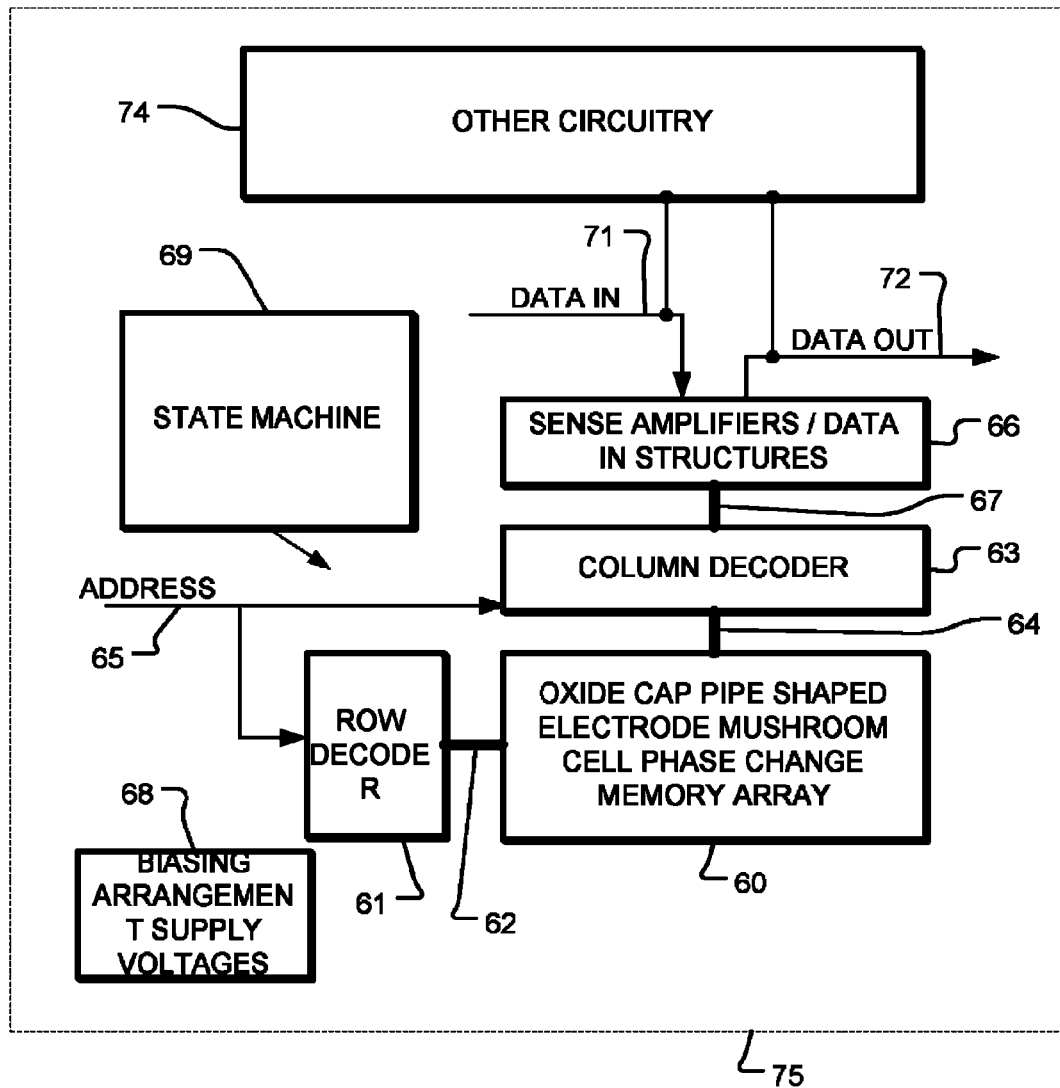
FIG. 5 is a block diagram of an integrated circuit device including a pipe-shaped electrode phase change memory array and other circuitry.

FIG. 5 is a simplified block diagram of an integrated circuit according to an embodiment of the present invention. The integrated circuit 74 includes a memory array 60 implemented using pipe-shaped electrode phase change memory cells, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 6:
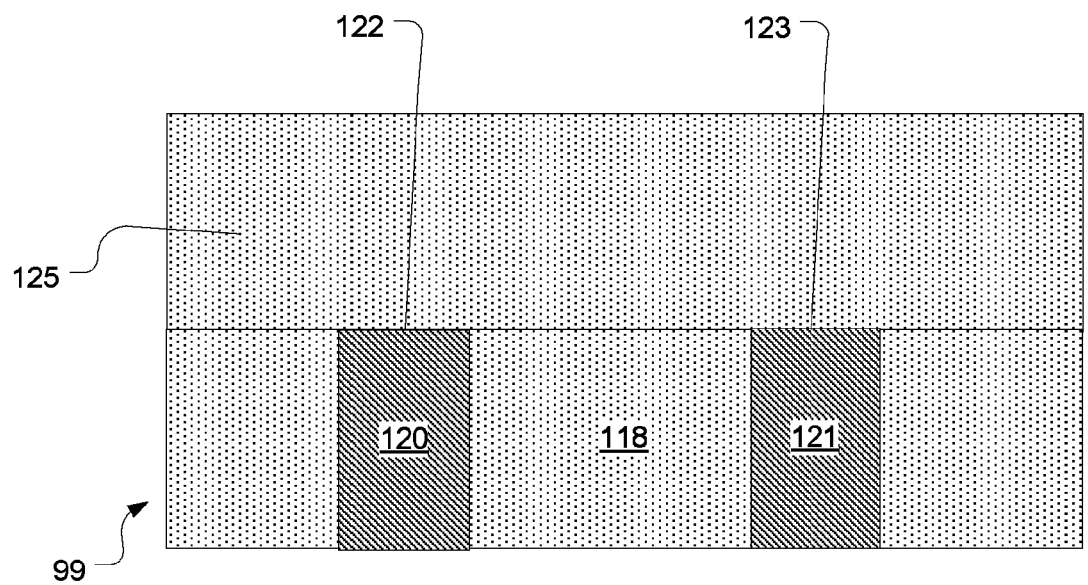
FIGS. 6-12 illustrate respective stages in a first alternative manufacturing process based on a via filling approach for a pipe-shaped electrode in an integrated circuit, and a phase change memory element.

FIGS. 6-12 show stages of a preferred, via-based manufacturing process for pipe-shaped electrode memory cells as shown in FIG. 1. FIG. 6 illustrates a top layer of a substrate 99, including an interlayer dielectric layer 118 having contacts 122, 123 formed by exposed top surfaces of plugs 120, 121 that connect underlying access structures (not shown) to the memory cells. The substrate may embody a variety of access structures coupled to, or replacing the plugs 120, 121, including columnar FET or bipolar transistors or diodes, and planar FETs, diodes, or bipolar junction transistors.

In representative embodiments, the interlayer dielectric layer 118 comprises a silicon dioxide, silicon nitride or doped silicon oxide material. The plug structures 120, 121 comprise tungsten plugs. Other types of conductors can be used as well for the plug structures 120, 121 as well, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O.

In the stage of manufacturing illustrated by FIG. 6, a layer 125 of fill material such as silicon dioxide is formed over the surface of the substrate 99. The thickness of the layer 125 depends on the ultimate dimensions of the device to be made. For a manufacturing process having a minimum feature size in the range of 50 to 100 nm, the thickness of the layer 125 may be of the same order about 50 to 100 nm, or thicker. Also, other dielectric fill materials may be chosen for compatibility with the subsequent manufacturing processes.

Figure 7:
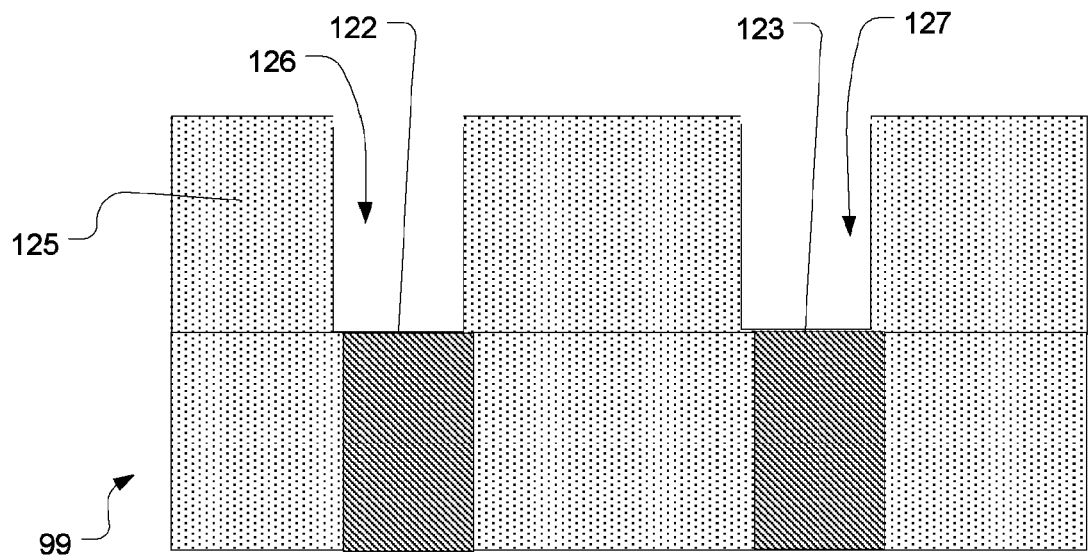

FIG. 7 illustrates a next stage in the process, after patterning and etching vias 126, 127 over the contacts 122, 123. A lithographic process, or sub-lithographic process, is used to define the vias 126, 127 aligned with the underlying contacts 122, 126.

Figure 8:
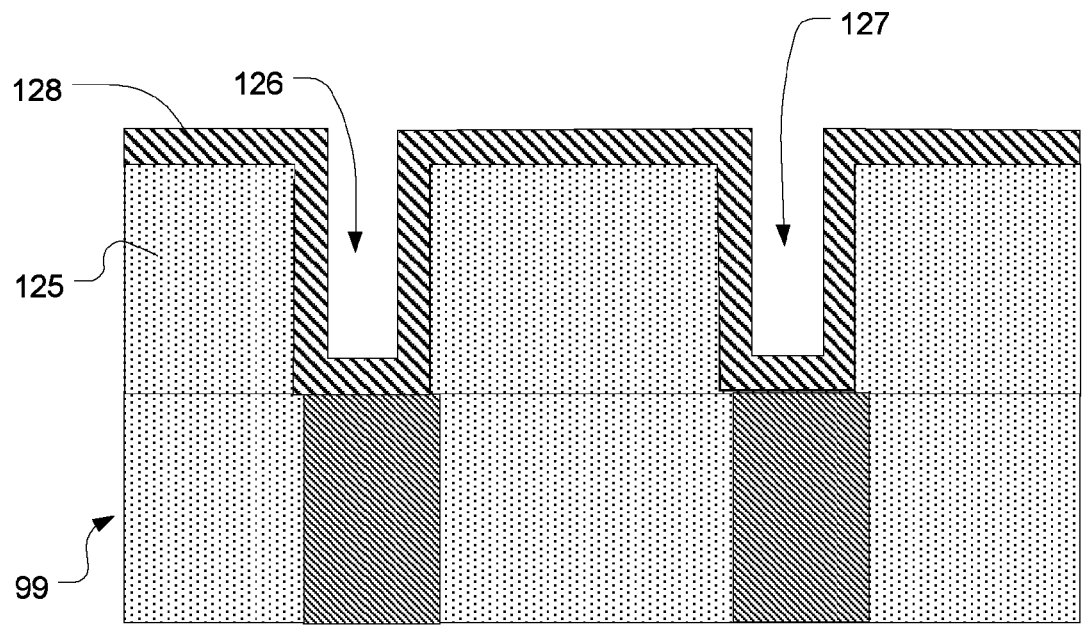

FIG. 8 illustrates a next stage in the process after deposition using a conformal process of a layer of electrode material 128 such as titanium nitride as explained above. The thickness of the layer of electrode material 128 on the side walls of the vias 126, 127 depends on the ultimate dimensions desired. An embodiment in which the diameter of the via is on the order of 5 to 100 nm, the thickness of the electrode layer on the side walls of the via 126, 127 (corresponding to the thickness T2 in FIG. 1) can be on the order of 1 to 20 nm.

Figure 9:
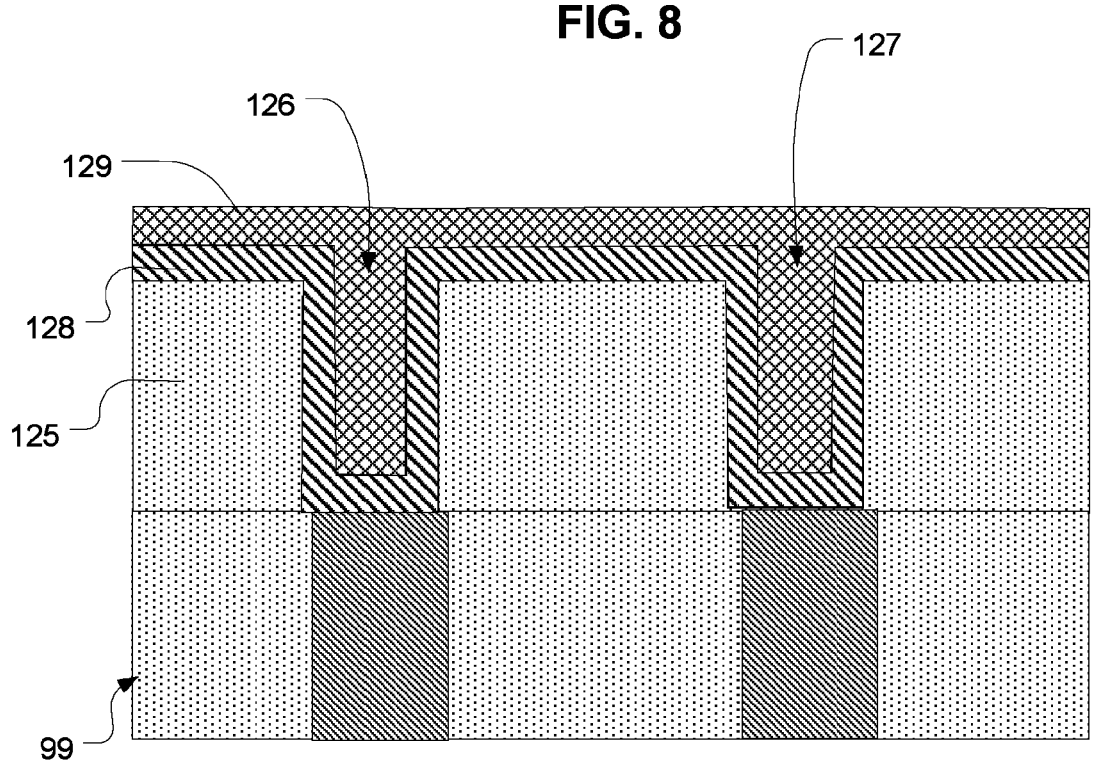

FIG. 9 shows a next stage, after deposition of silicon material 129, such as polysilicon, filling the remaining portions of vias 126 and 127. In a representative embodiment, the silicon material 129 can be doped with an n-type material such as phosphorus to enhance its response to thermal oxidation as explained below. Also, other forms of silicon can be utilized, including amorphous silicon for example.

Figure 10:
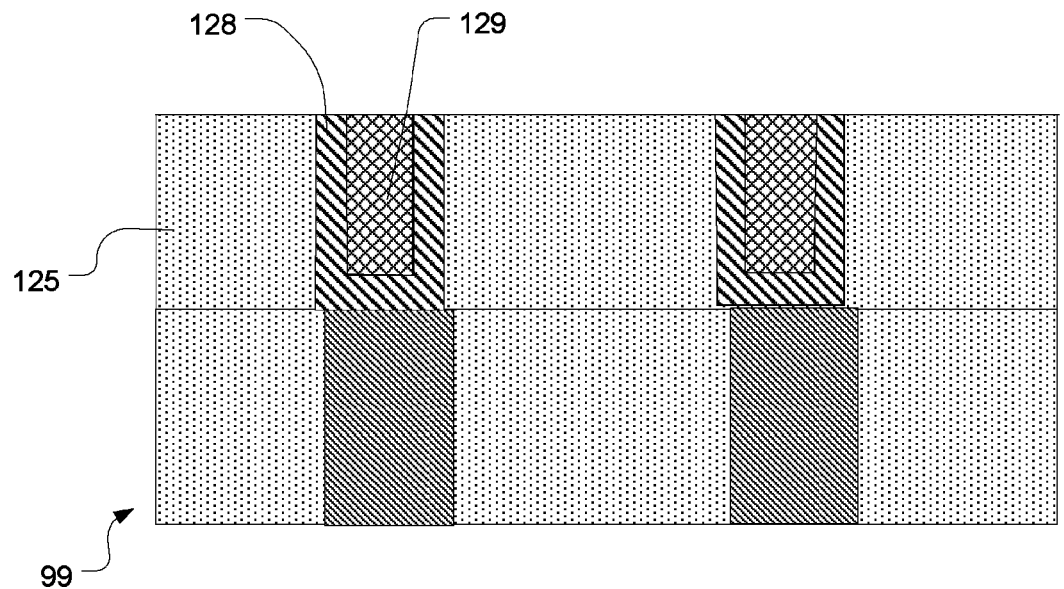

FIG. 10 illustrates a next stage, after a chemical mechanical polishing process or other planarizing step, which removes the electrode material 128 and the silicon material 129 from the top surface of the structure, leaving the electrode material 128 lining the vias and the silicon material 129 filling the lined vias.

Figure 11:
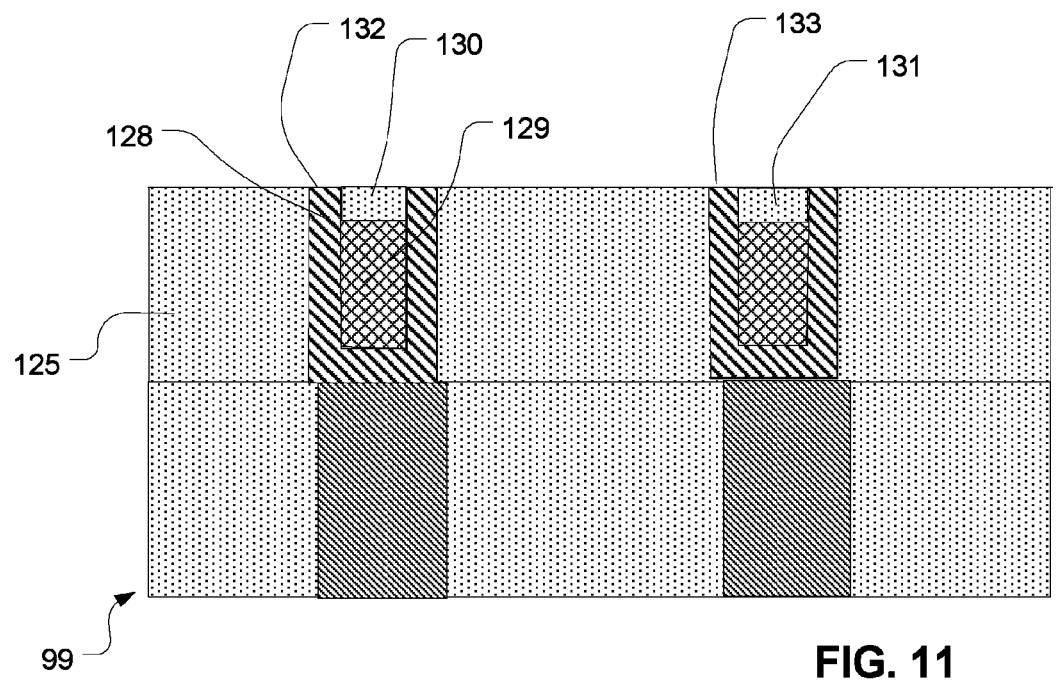

Next, as shown in FIG. 11, the structure is exposed to an oxidizing environment which oxidizes the silicon material 129 at a faster rate than the electrode material 128. As a result, oxide caps 130, 131 are formed over the layer of silicon material 129 within the vias. In embodiments using silicon material 129, standard thermal oxidation processes can be utilized. Alternative oxidation processes include aluminum as the conducting fill material and aluminum oxide as the insulating fill material. Also, in other alternatives, a nitridation process is used, such as exposing the material to ammonium.

Next, the resulting structure is subject, if necessary, to chemical mechanical polishing or another planarizing step, to remove any residual oxide or nitride from the top surfaces 132, 133 of the electrode material 128.

Figure 12:
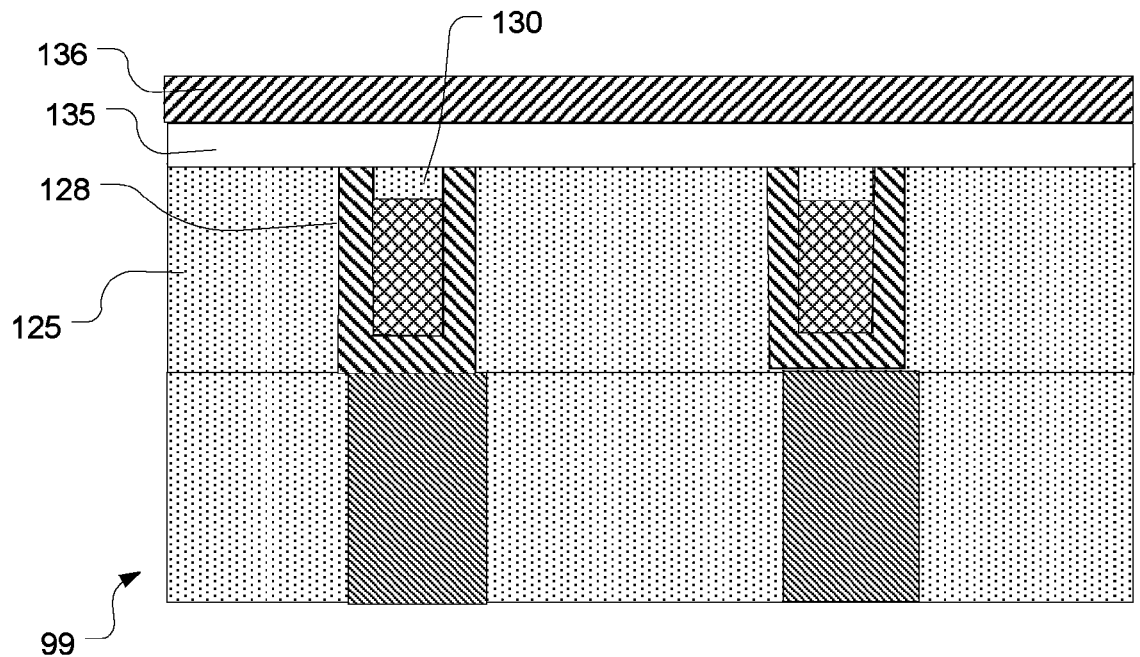

As shown in FIG. 12, the process of manufacturing a memory cell using the electrode with a ring-shaped contact surface includes deposition of a programmable resistance material 135 such as a phase change material, and a top electrode material 136 over the programmable resistance material. Any necessary patterning steps are carried out as required for the particular memory structure be utilized. Finally, back end process steps are executed to complete the integrated circuit, including interlayer dielectric fill processes, metallization processes, capping processes and so on.

Figure 13:
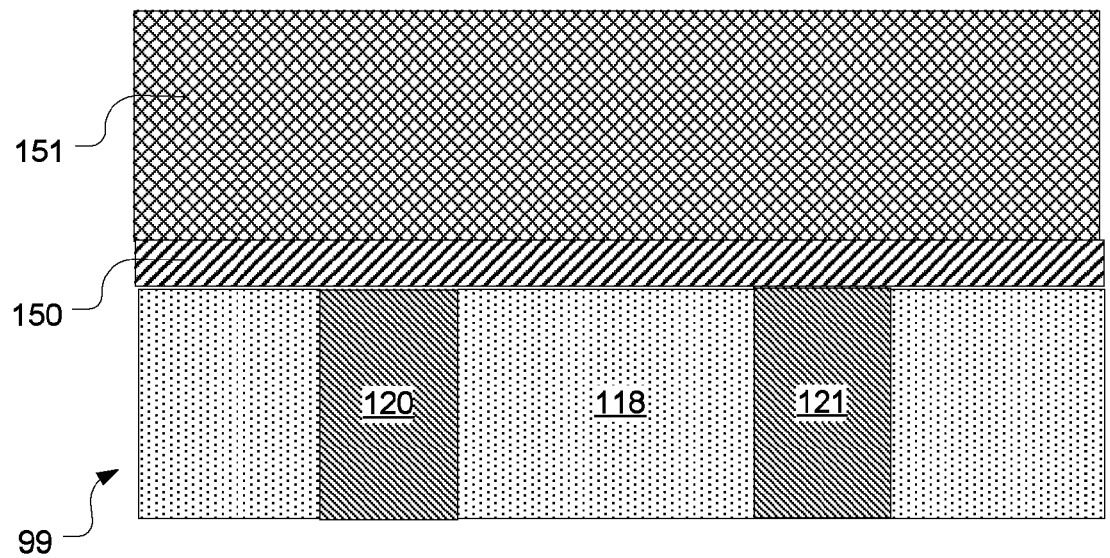
FIGS. 13-18 illustrate respective stages in a second alternative manufacturing process based on a pillar forming approach for a pipe-shaped electrode in an integrated circuit, and a phase change memory element.

FIGS. 13-18 show stages of a pillar-based manufacturing process for pipe-shaped electrode memory cells as shown in FIG. 1. FIG. 13 illustrates a structure 99 after front-end-of-line processing. Plugs 120, 121 are included, formed in corresponding vias that extend through interlayer dielectric layer 118, to the top surface. At this stage a layer of electrode material 150 has been deposited over the substrate 99, followed by a layer of silicon, or other oxidizable, conductive material 151.

Optionally, the material 150 is planarized by chemical mechanical polishing or otherwise to provide a uniform layer of electrode material over the array region on the integrated circuit. The finished layer of material 150 has a thickness for example in a range of 20 to 100 nanometers. The first electrode material 150 may be Ti, Al, W, TiN, Cu, or other metals compatible with the process, selected for good adhesion to the top of the plugs, for adhesion to the second electrode material, and for stability.

Next, a layer of conductive silicon material 151 is deposited using chemical vapor deposition, or other processes known in the art. The thickness of the material 151 for example can be in the range of 50 to 200 nanometers.

Figure 14:
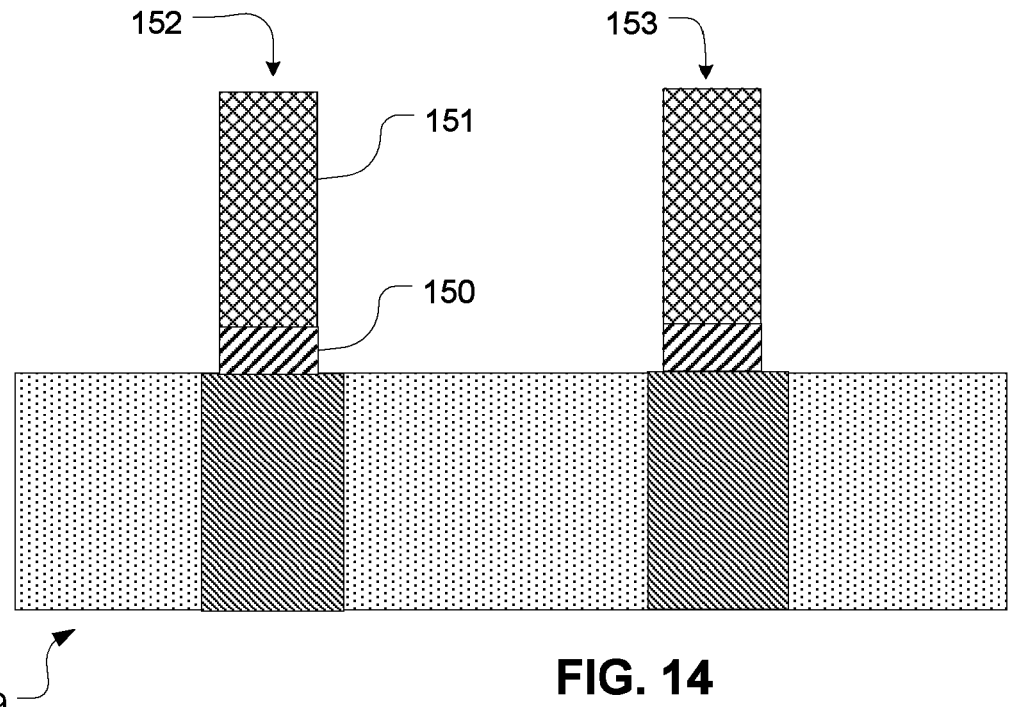

A next stage in the process as illustrated in FIG. 14. According to this example process, a layer of photoresist is deposited and developed to form photoresist masks have an aerial view shape which is a circular, elliptical or square for example, and are aligned with the plugs 120 and 121, within the tolerances of the photolithographic process. The photoresist masks are trimmed to form smaller masks. For example, the photoresist masks can be etched using an oxygen plasma to form a sub-lithographic, smaller masks which preserve the aerial view shape of the masks, with reduced diameter.

The smaller masks are used as an etch mask to define pillar structures 152, 153, that include respective disc-shaped members comprising material 150 from the electrode layer and respective pillar-shaped silicon members comprising material 151. In embodiments of the cell, the pillar-shaped structures 152, 153 have diameters of about 20 to 50 nanometers. The disc-shaped members of conductive material 150 overlie the tops of the plugs 120, 121, and establish good electrical and physical contact with the plugs 120, 121.

Figure 15:
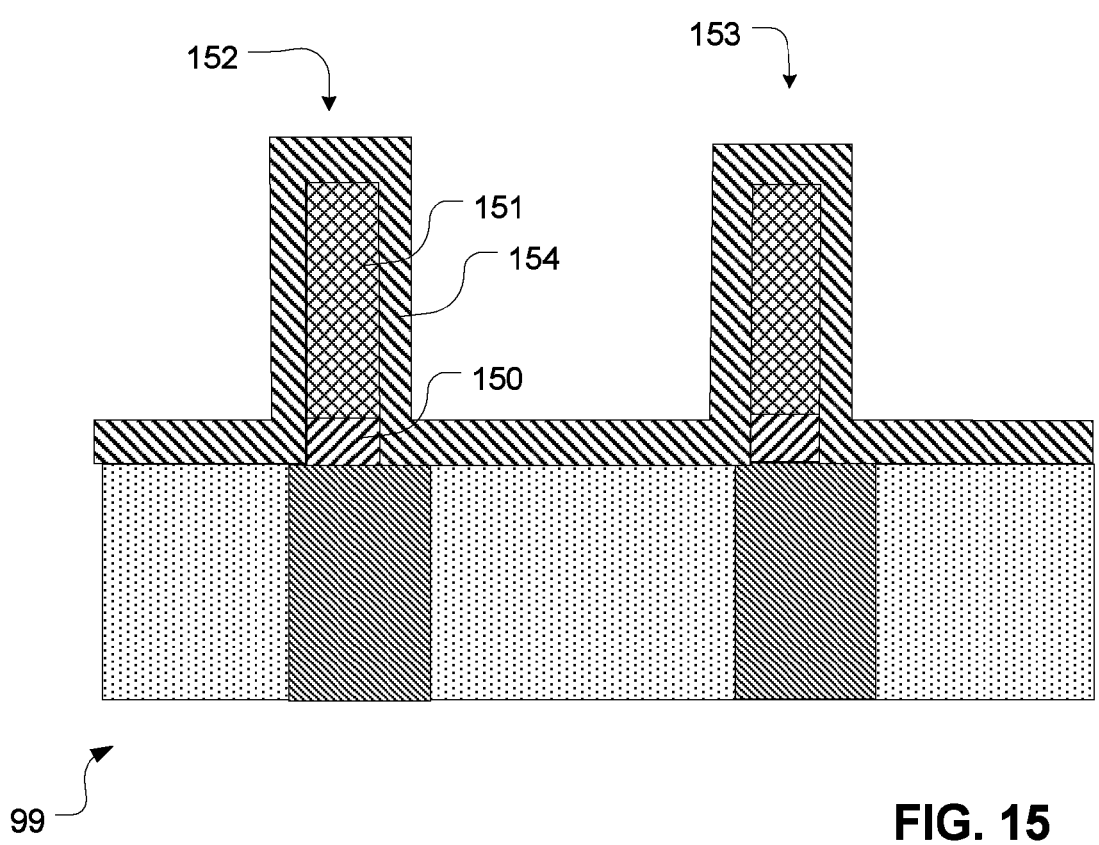

FIG. 15 illustrates a next stage in the process, after conformal deposition of a layer of a second electrode material 154 over the pillar structures 152, 153 and over the surface of the substrate. In embodiments of the process, the second electrode material 154 is the same as the first electrode material 150. In other embodiments, the second electrode material 154 has higher resistivity than the first electrode material 150, and good adhesion characteristics to the programmable resistance material. For example, the second electrode material can be TaN, TiN, AlN, metal oxides such as iridium or lithium oxides, or combinations of materials. The second electrode material can be deposited using well-known technologies including chemical vapor deposition, sputtering, or other conformal deposition technologies suitable for the selected material.

Figure 16:
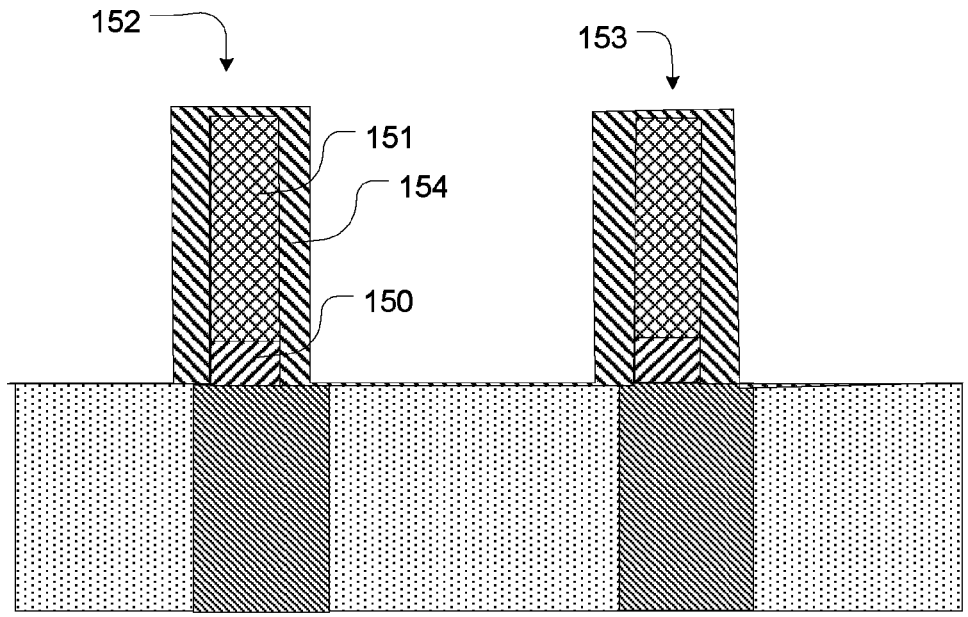

As shown in FIG. 16, a next processing step includes anisotropic etching of the layer of material 154 to form sidewall structures on the pillar structures 152, 153, while removing the electrode material from the surface of the substrate 99.

Figure 17:
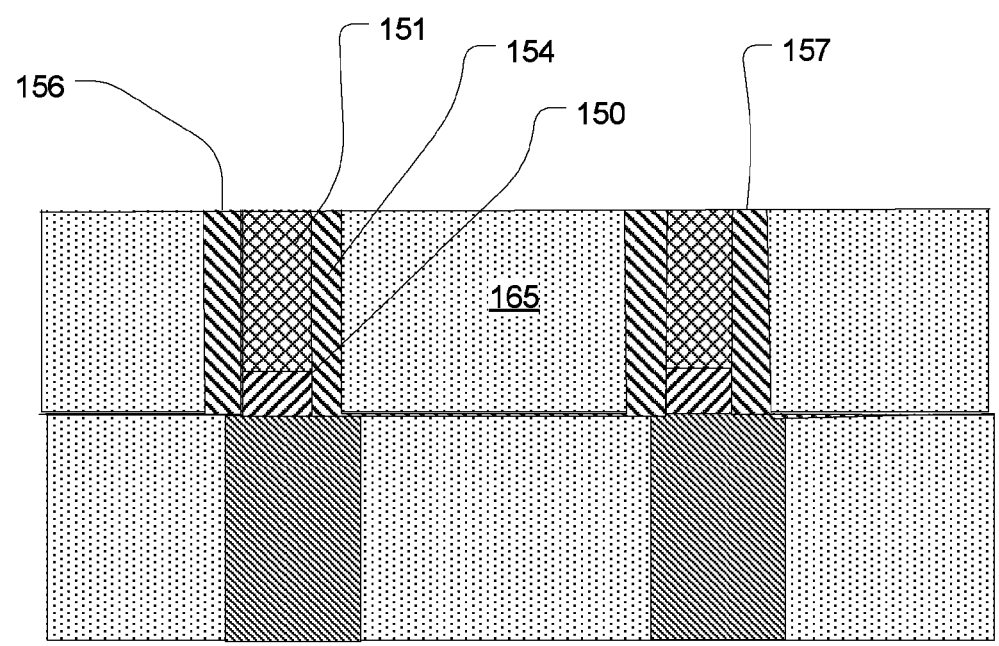

Next, as shown in FIG. 17, a fill layer (remaining portions after etchback are labeled 165) is deposited followed by an etchback by chemical mechanical polishing, or otherwise, to a level below the tops of the pillar structures 152, 153 to remove the electrode material from the top of the pillar structures 152, 153 and establish the height of the pipe-shaped members. After the etchback, ring-shaped top surfaces 156, 157 of the pipe-shaped electrode members are exposed on a surface of the resulting structure. The height of the pipe-shaped electrode members in a representative embodiment is about 80 to 150 nanometers, such as about 100 nanometers. The thickness of the sidewalls of the pipe-shaped electrode members of electrode material 154 is between about 10 and 30 nanometers, such as about 20 nanometers. The thickness of the disc-shaped members of electrode material 150 from layer can be therefore at least twice the thickness of the sidewalls on the pipe-shaped electrode members for example.

Figure 18:
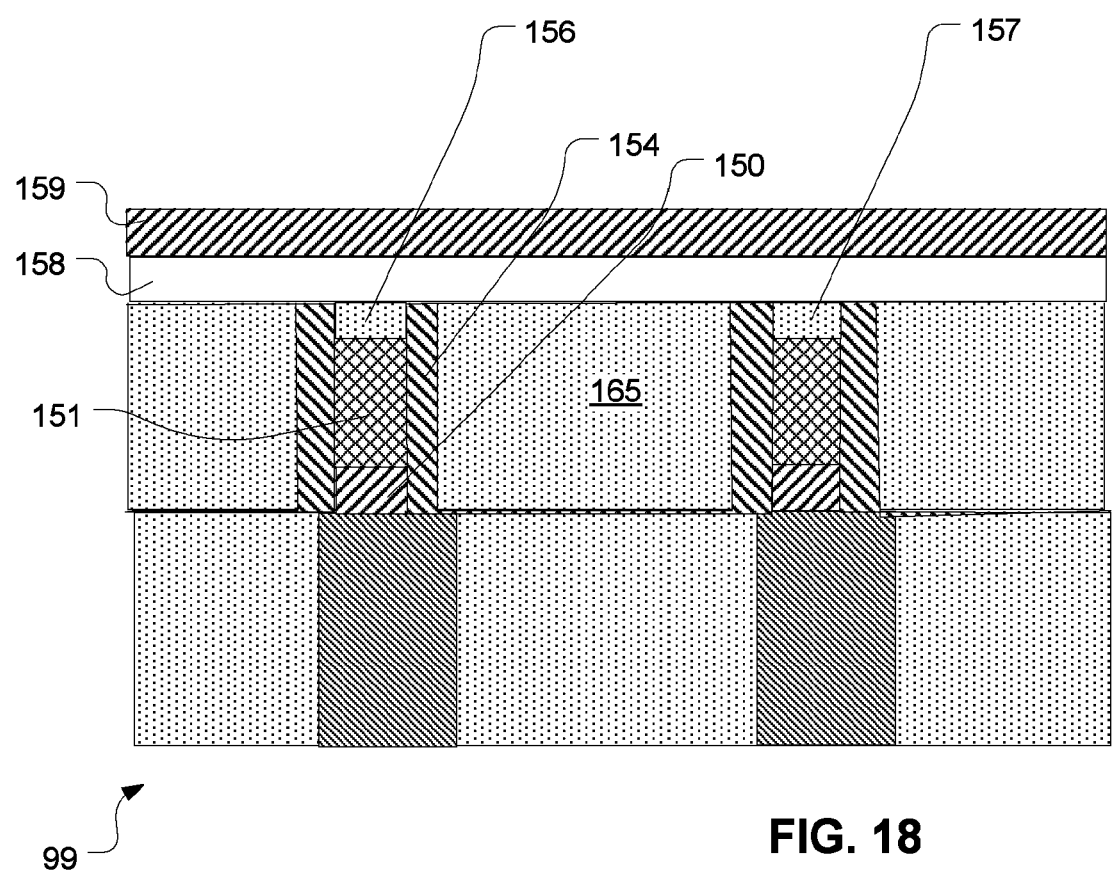

FIG. 18 illustrates a structure after depositing, by sputtering for example, a conformal layer 158 of GST, or other programmable resistance material, over the surface of the fill layer 165. GST can be deposited using sputtering with collimation at about 250 degrees C. Alternatively, the GST can be deposited using a metal organic chemical vapor deposition (MO-CVD) process. In a representative embodiment, the conformal layer 158 comprises a thin film having a thickness of about 30 to 100 nanometers. Next, a layer 159 of electrode material, which can be the same as the electrode material 150, is deposited over the layer 158, having a thickness in the range of 30 to 100 nanometers.

Figure 19:
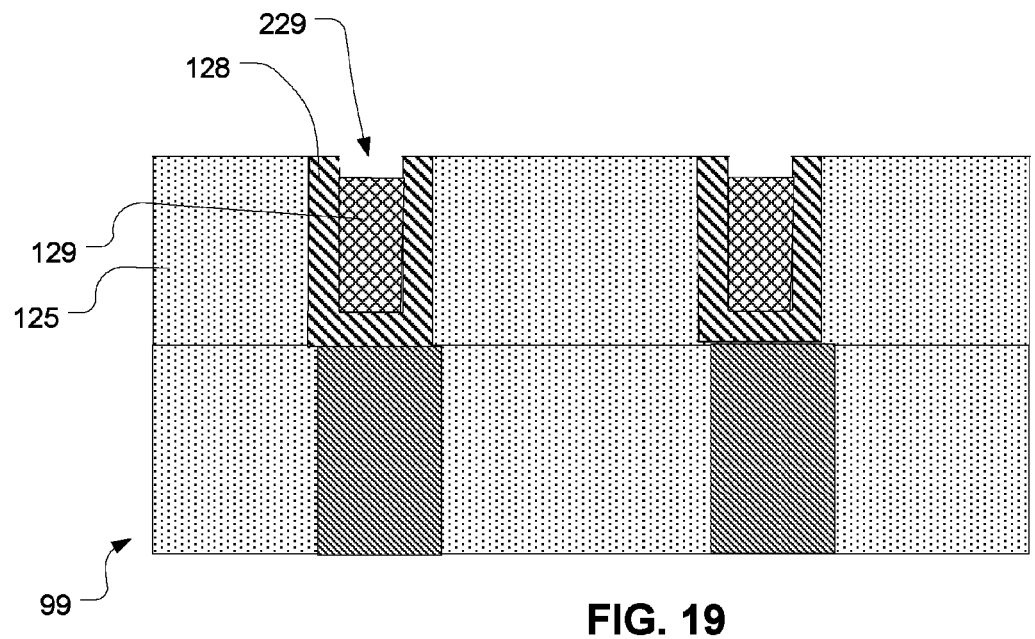
FIGS. 19-21 illustrate stages in a recess etch/fill process for forming a second layer of insulating fill material.
Figure 20:
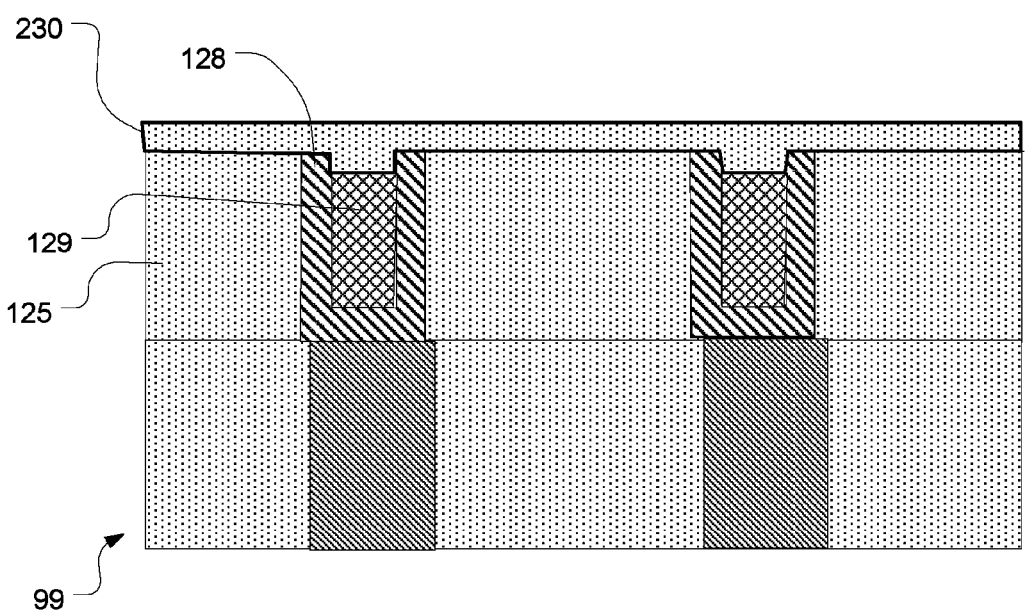
Figure 21:
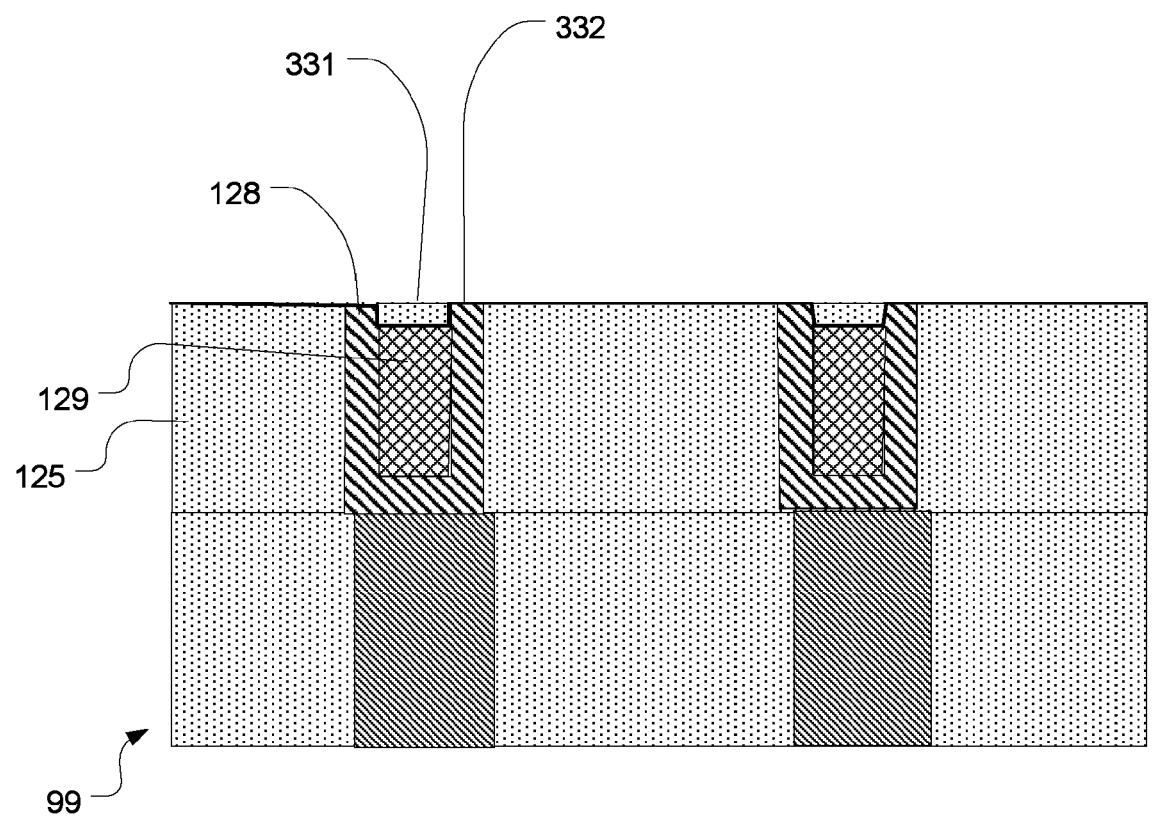

FIGS. 19-21 illustrate stages in a process involving a recess etched/fill technique for making the insulating cap member 13. The stages start after the stage shown in FIG. 10 or in FIG. 17. Using the reference numerals of FIG. 10 where appropriate, as described above a chemical mechanical polishing process or other planarizing step, leaves the electrode material 128 lining the vias through layer 125, and the conducting fill material 129 filling the lined vias. Thus, FIG. 19 illustrates a structure resulting after a recess etch which selectively removes the conducting fill material, and leaves a recess 229.

Next is illustrated in FIG. 20, an insulating fill material 230 is deposited over the structure, filling the recess to 229. Finally, as illustrated in FIG. 21, a chemical mechanical polishing process or other similar planarizing process is executed, so that a top surface 331 of the insulating fill material is flush with a top surface 332 of the pipe-shaped or trench-shaped member formed by electrode material 128. The structure of the memory device can be completed as described above. According to the process of FIGS. 19-21, the insulating fill material is chosen for process compatibility factors and is not necessarily an oxide or nitride of the conducting fill material.

In embodiments described, the pipe-shaped member has sides that are continuous around the perimeter of the cell. In alternatives, a rectangular pipe-shaped member is formed, so that it can be characterized as a trench-shaped member. Also, deposition techniques could be used to make the pipe-shaped or trench-shaped member discontinuous around the sides, further reducing the volume the active regions.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit device, comprising:
    an electrode comprising a pipe-shaped member of an electrode material having a first end, a second end and a ring-shaped surface at the second end, wherein the pipe-shaped member has an inside surface and an outside surface;
    a first layer of conducting fill material inside the inside surface of the pipe-shaped member characterized by being electrically conductive; and
    a second layer of insulating fill material over the first and extending to the second end of the pipe-shaped member, wherein the insulating fill material is characterized by being an oxide or nitride of the conducting fill material; and
    wherein the pipe-shaped member has a thickness between the inside surface and the outside surface less than 30 nm.

2. The device of claim 1, wherein the conducting fill material comprises silicon.

3. The device of claim 1, wherein the conducting fill material comprises n-type silicon.

4. The device of claim 1, including a disc-shaped member of an electrode material adjacent the first end of the pipe-shaped member.

5. An integrated circuit device, comprising:
    an electrode com risin a pipe-shaped member of an electrode material having a first end, a second end and a ring-shaped surface at the second end, wherein the pipe-shaped member has an inside surface and an outside surface;
    a first layer of conducting fill material inside the inside surface of the pipe-shaped member characterized by being electrically conductive; and
    a second layer of insulating fill material over the first and extending to the second end of the pipe-shaped member;
    a layer of programmable resistance material in contact with the ring-shaped surface of the pipe-shaped member; and
    a second electrode in contact with the layer of programmable resistance material; and wherein the pipe-shaped member has a thickness between the inside surface and the outside surface less than 30 nm.

6. The device of claim 5, wherein the insulating fill material is characterized by being an oxide or nitride of the conducting fill material.

7. The device of claim 5, wherein the programmable resistance material comprises a phase change material.

8. A method for manufacturing an electrode in an integrated circuit device, comprising:
forming an electrode comprising a pipe-shaped member having a first end, a second end, and a ring-shaped surface at the second end, wherein the pipe-shaped member has an inside surface and an outside surface;
forming a first layer of conducting fill material inside the inside surface of the pipe-shaped member;
forming a second layer of insulating fill material inside the inside surface of the pipe-shaped member over the first layer and extending to the second end of the pipe-shaped member;
forming a layer of programmable resistance material in contact with the ring-shaped surface of the pipe-shaped member; and
forming a second electrode in contact with the layer of programmable resistance material; and
wherein the pipe-shaped member has a thickness between the inside surface and the outside surface less than 30 nm.

9. The method of claim 8, wherein said conducting fill material has higher rate of oxidation or nitridation than the ring-shape surface of the pipe shaped member.

10. The method of claim 8, wherein said forming a second layer of insulating fill material includes at least one of oxidizing and nitridizing the conducting fill material.

11. The method of claim 8, wherein the conducting fill material comprises silicon, and said forming a second layer includes at least one of oxidizing and nitridizing said silicon.

12. The method of claim 8, wherein the programmable resistance material comprises a phase change material.

13. The method of claim 8, wherein
said forming a first layer of conducting fill material includes forming a structure having a top surface of the first layer of conducting fill material flush with a top surface of the pipe-shaped member, and etching the conducting fill material to form a recess inside the pipe-shaped member; and
said forming a second layer of insulating fill material includes filling said recess with said insulating fill material and planarizing the resulting structure to expose said ring-shaped surface.

* * * * *

UNITED STATES PATENT AND TRADEMARK OFFICE
CERTIFICATE OF CORRECTION

PATENT NO. : 8,084,760 B2  Page 1 of 1
APPLICATION NO. : 12/426809
DATED : December 27, 2011
INVENTOR(S) : Hsiang-Lan Lung et al.

It is certified that error appears in the above-identified patent and that said Letters Patent is hereby corrected as shown below:

In the Claims

\*\* Column 12, line 54, claim 5, delete "com risin" and insert --comprising-- \*\*

Signed and Sealed this
Sixth Day of March, 2012

David J. Kappos
*Director of the United States Patent and Trademark Office*